(12) United States Patent
Shi (10) Patent No.: US 8,102,211 B2
(45) Date of Patent: Jan. 24, 2012

(54) RAIL-TO-RAIL INPUT STAGE CIRCUIT WITH DYNAMIC BIAS CONTROL

(75) Inventor: Chunlei Shi, Poway, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/796,595

(22) Filed: Jun. 8, 2010

(65) Prior Publication Data
US 2011/0298541 A1    Dec. 8, 2011

(51) Int. Cl.
*H03F 3/45*    (2006.01)
(52) U.S. Cl. ........................................ 330/259; 330/258
(58) Field of Classification Search ........... 330/252–261
See application file for complete search history.

(56) References Cited

U.S. PATENT DOCUMENTS

| | | | |
|---|---|---|---|
| 4,977,378 A | 12/1990 | Tero | |
| 5,608,352 A | 3/1997 | Itakura | |
| 5,633,611 A | 5/1997 | Kohno et al. | |
| 7,187,236 B2 * | 3/2007 | Britton et al. | 330/258 |
| 2006/0244532 A1 | 11/2006 | Trifonov et al. | |
| 2009/0086857 A1 | 4/2009 | Wu | |

FOREIGN PATENT DOCUMENTS

| | | |
|---|---|---|
| DE | 10154170 A1 | 6/2002 |
| EP | 0955725 A2 | 11/1999 |
| WO | WO9733365 A1 | 9/1997 |
| WO | WO0249208 A2 | 6/2002 |
| WO | WO03061118 A1 | 7/2003 |

OTHER PUBLICATIONS

Haga Yasutaka, et al., "Achieving rail-to-rail input operation using level-shift multiplexing technique for all CMOS op-amps", In: Proceedings of the 51st Midwest Symposium on Circuits and Systems, 2008 (MWSCAS 2008). IEEE, pp. 698-701.
J. Francisco Duque-Carrillo, et al., "1-V rail-to-rail operational amplifiers in standard CMOS technology", vol. 35, p. 33, Jan. 2000.
Mingsheng Peng, et at., "A 1-V Quasi Rail-to-Rail Operational Amplifier with a Single Input Differential Pair," in proc. 2007 IEEE Region 5 Technical Conf, Fayetteville, AR, pp. 93-96.

(Continued)

*Primary Examiner* — Hieu Nguyen
(74) *Attorney, Agent, or Firm* — Ramin Mobarhan (57) ABSTRACT

An improved rail-to-rail (R-R) input stage circuit with dynamic bias control is described. Input stage circuit includes a differential pair circuit, a level shifted differential pair and a bias control circuit. The differential pair circuit and the level shifted differential pair are of same type, non-complementary MOS devices. In exemplary embodiments, a first and a second bias control circuits dynamically control the bias current of the level shifted differential pair and the bias current of the differential pair circuit, respectively, in response to the input common mode voltage of the rail-to-rail input stage circuit. First and second bias control circuits maintain the output impedance of the R-R input stage circuit at a desired level, as the R-R input stage circuit operates outside the input common mode voltage range supported by the level shifted differential pair and the differential pair circuit, respectively. Further exemplary embodiments include a first and a second gm control circuits. Gm control circuits maintain the transconductance of the R-R input stage circuit substantially constant over the entire input common mode voltage range of the R-R input stage circuit.

26 Claims, 9 Drawing Sheets

OTHER PUBLICATIONS

Tongyu Song, et al., "A Robust Rail-to-Rail Input Stage with Constant-gm and Constant Slew Rate Using a Novel Level Shifter", IEEE International Symposium on Circuits and Systems, New Orleans, U.S.A., May 2007; 477-480.
Carrillo J M et al: "Constant-GM Constant-Slew-Rate High-Bandwidth Low-Voltage Rail-To-Rail CMOS Input Stage For VLSI Cell Libraries", IEEE Journal Of Solid-State Circuits, IEEE Service Center, Piscataway, NJ, USA, vol. 38, No. 8, Aug. 1, 2003, pp. 1364-1372, XP001170976.
International Search Report and Written Opinion—PCT/US2011/039649—ISA/EPO—Nov. 23, 2011.
Partial International Search Report—PCT/US2011/039649—ISA/EPO—Sep. 30, 2011.

* cited by examiner

RAIL-TO-RAIL INPUT STAGE CIRCUIT WITH DYNAMIC BIAS CONTROL

TECHNICAL FIELD

The present disclosure relates to electronics and more specifically, to improvements in rail-to-rail input stage circuits for integrated circuits.

BACKGROUND

An input stage circuit is a basic building block for analog or mixed signal circuit. A first stage of an analog or mixed signal circuit may typically include a rail-to-rail (R-R) input stage circuit operating over a rail-to-rail input common mode voltage range. An example of such an analog or mixed signal circuit is an operational amplifier, a comparator or an analog-to-digital converter. An R-R input stage circuit is designed to handle a wide input common-mode voltage range. Typically, the R-R input stage circuit may handle an input common mode voltage ranging from a negative supply (rail) or ground to a positive supply (rail), hence the name rail-to-rail.

Analog or mixed signal circuits used in low-voltage CMOS integrated-circuit manufacturing processes normally require a differential input stage circuit that can operate even when its input common mode voltage is near the supply rails.

Figure 1:
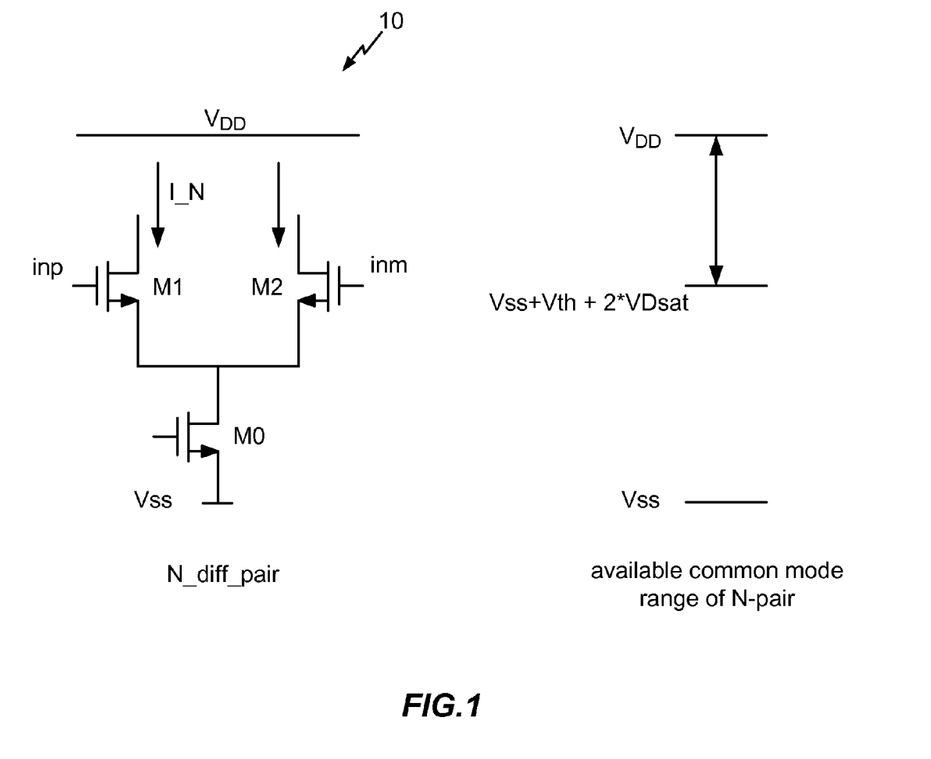
FIG. 1 shows a typical N_diff_pair.
Figure 2:
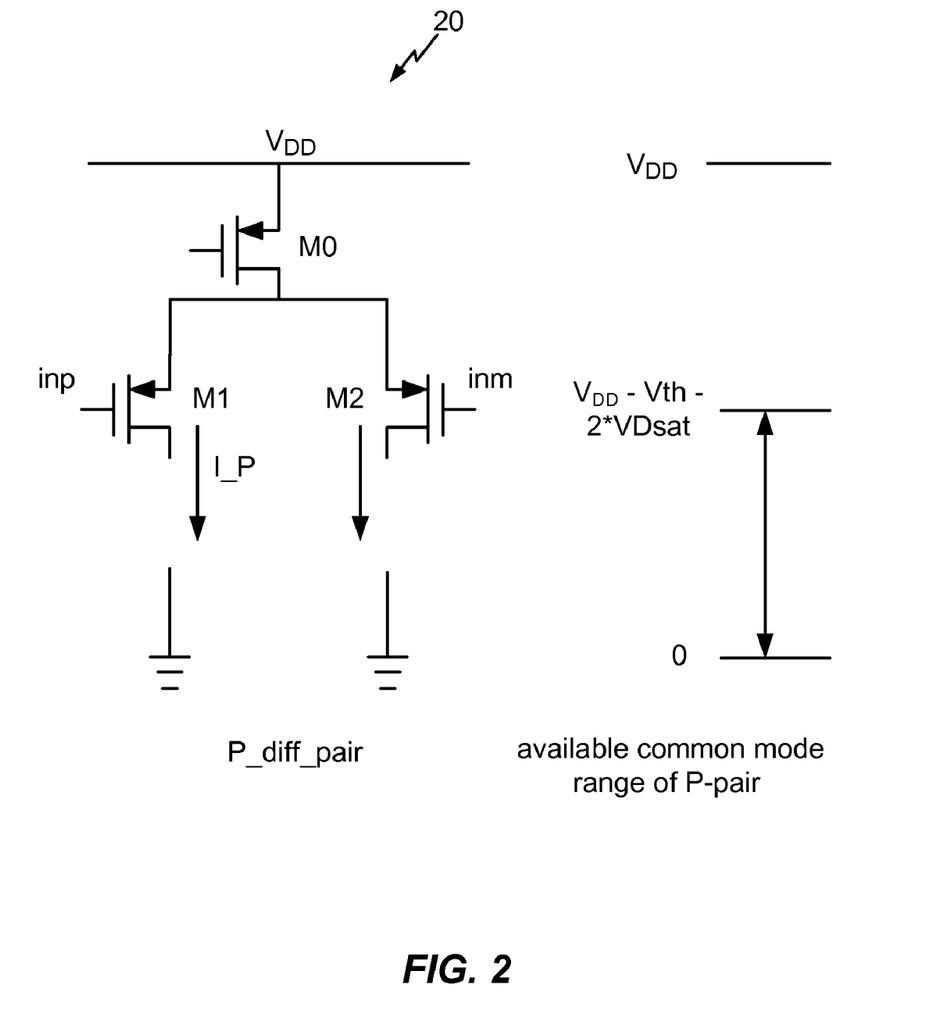
FIG. 2 shows a typical P_diff_pair.

Conventional R-R input stage circuits use two complimentary differential transistor pairs. The first differential pair (N_diff_pair) includes a pair of matched NMOS transistors and the second differential pair (P_diff_pair) includes a pair of matched PMOS transistors. FIG. 1 shows a typical N_diff_pair. The input common mode of differential pairs is limited. For N_diff_pair 10, the input common mode is limited to the voltage range from $V_{SS}+V_{th}+2*V_{Dsat}$ to $V_{DD}$. A saturation voltage for M0, M1 and M2 is defined as $V_{Dsat}$. A threshold of MOS transistors M1 and M2 is defined as $V_{th}$. $V_{SS}$ and $V_{DD}$ being the negative and the positive supply, respectively. FIG. 2 shows a typical P_diff_pair. For P_diff_pair 20, the input common mode is limited to the voltage range from $V_{SS}$ to $V_{DD}-V_{th}-2*V_{Dsat}$. Thus if $V_{DD}>V_{SS}+2*(V_{th}+2V_{Dsat})$, the combination of a P_diff_pair and an N_diff_pair can be used to support the entire common mode range from the negative to the positive supply.

Figure 3:
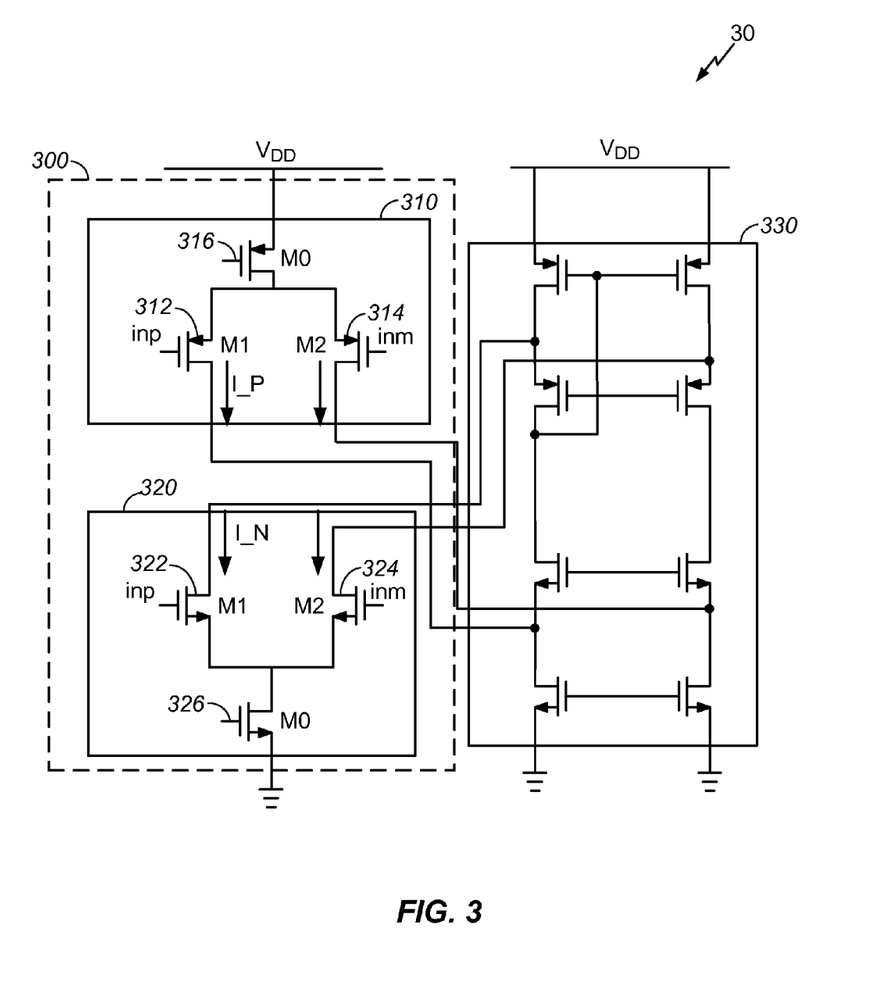
FIG. 3 is an example of an R-R input stage circuit including complementary differential pairs of transistors.

FIG. 3 is an example of an R-R input stage circuit including complementary differential pairs of transistors. R-R input stage circuit 30 includes first stage circuit 300 and second stage circuit 330. First stage circuit 300 includes first differential pair 310 and second differential pair 320. The first differential pair is a P_diff_pair and the second differential pair is an N_diff_pair, similar to the P_diff_pair and the N_diff_pair of FIG. 2 and FIG. 1, respectively. R-R input stage circuit 30 shown in FIG. 3 is also known as a two stage folded cascode amplifier.

Second stage circuit 330 combines the current flowing through P_diff_pair 310 and N_diff_pair 320. These currents inherently flow in opposite directions. Therefore, a second stage is required to fold and sum the currents flowing through P_diff_pair 310 and N_diff_pair 320.

A drawback of R-R input stage circuit 30, which uses complementary differential pairs, is the requirement of a second stage circuit (which in the example is second stage circuit 330). The second stage circuit limits the bandwidth and operational speed of the R-R input stage circuit. As a result, the bandwidth and speed of any circuit embodying the R-R input stage is also limited.

Furthermore, it is a design challenge to optimize the design of R-R input stage circuit 30 for noise, power consumption and speed.

More recently, R-R input stage circuits are developed based on non-complementary differential pairs. They include two sets of same type of differential pairs to overcome the shortcomings of the R-R input stage circuits that use complementary differential pairs.

While these known input stage circuits offer a satisfactory performance and the ability to operate over a wider common mode range reaching from the negative power supply potential up to the positive power supply potential, there remains the desire to further improve the performance of an input stage circuit. Improvements are particularly directed to overcome performance issues that appear as the input common-mode voltages are near the supply rails. As the input common mode approaches the supply rails, the internal bias points change significantly. This, in turn, can lead to degradation in performance of the R-R input stage circuit and consequently of the entire analog or mixed signal circuit that follows the R-R input stage circuit.

Biasing circuitry to improve rail-to-rail operation of non-complementary differential pair input stage circuits is necessary for very low supply voltage operation.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The present disclosure is directed to improved rail-to-rail (R-R) input stage circuits with dynamic bias control. The proposed R-R input stage circuits, discussed in detail later on, include a differential pair circuit, a level shifted differential pair and a bias control circuit. The differential pair circuit and the level shifted differential pair are of the same type MOS devices, also known as non-complementary MOS devices.

In such R-R input stage circuits, the minimum supply voltage is imposed by the differential pair circuit and is equal to one threshold voltage ($V_{th}$) plus two saturation voltages ($V_{Dsat}$).

The biasing control circuit, according to the present disclosure, enables the minimum supply voltage operation as imposed by the differential pair circuit and at the same time overcomes any shortcomings in the performance as the input common mode voltages are near to the supply rails.

Particularly for high input common mode voltages, the differential pair transistors can go into the ohmic regime (linear region). As the differential pair transistors are directly connected to the output of the R-R input stage circuit, this may reduce the output impedance of the R-R input stage circuit, and therefore the gain of the R-R input stage circuit.

The techniques proposed up to now to avoid the reduction of the output impedance of the R-R input stage circuit require a supply voltage higher than the minimum imposed by the differential pair circuit. For example, U.S. Pat. No. 7,187,236 to Britton Jr. et al. describes using two non-complimentary differential pairs operating as an R-R input stage circuit. An additional pair of cascode devices is used to isolate the output of the R-R input stage circuit from a pair of differential transistors (M3a and M4a). This overcomes the problem of output impedance reduction of the R-R input stage circuit when the input common mode is high.

This specific technique stacks MOS devices by adding (cascoding) a pair of cascode devices on top of the differential pair transistors. Differential pairs using cascode devices require a higher voltage supply by at least a threshold voltage. This limits the lowest possible supply voltage required for operating an R-R input stage circuit. Consequently, this approach is not suited for modern ICs, which require very low supply voltage.

In a second example, international patent application WO03061118 filed on 21 Jan. 2002 to Herberg Mats describes having a biasing scheme using current steering for maintaining constant the output impedance of an R-R input stage circuit. This solution uses two non-complimentary differential pairs connected for rail-to-rail input common mode operation. The specific current steering technique also stacks MOS devices and is, therefore, not suited for modern ICs requiring very low supply voltage operation.

The present disclosure includes a bias control circuit that monitors the input common mode voltage of the R-R input stage circuit. The disclosed bias control circuit gradually turns off the level shifted differential pair and it eventually shuts downs the level shifted differential pair to maintain the output impedance of the R-R input stage circuit at a desired level. As a result, the level-shifted differential does not affect the normal operation of the differential pair circuit and therefore the operation of the R-R input stage circuit, when the input common mode voltage is outside the input common mode voltage range supported by the level shifted differential pair.

As opposed to previously disclosed solutions the exemplary embodiments of rail-to-rail input stage circuits discussed below may operate using the minimum possible power supply for a differential pair circuit, because they avoid using any form of cascoding either at the output of the differential pair or at the current control of the differential pair circuits.

Figure 4:
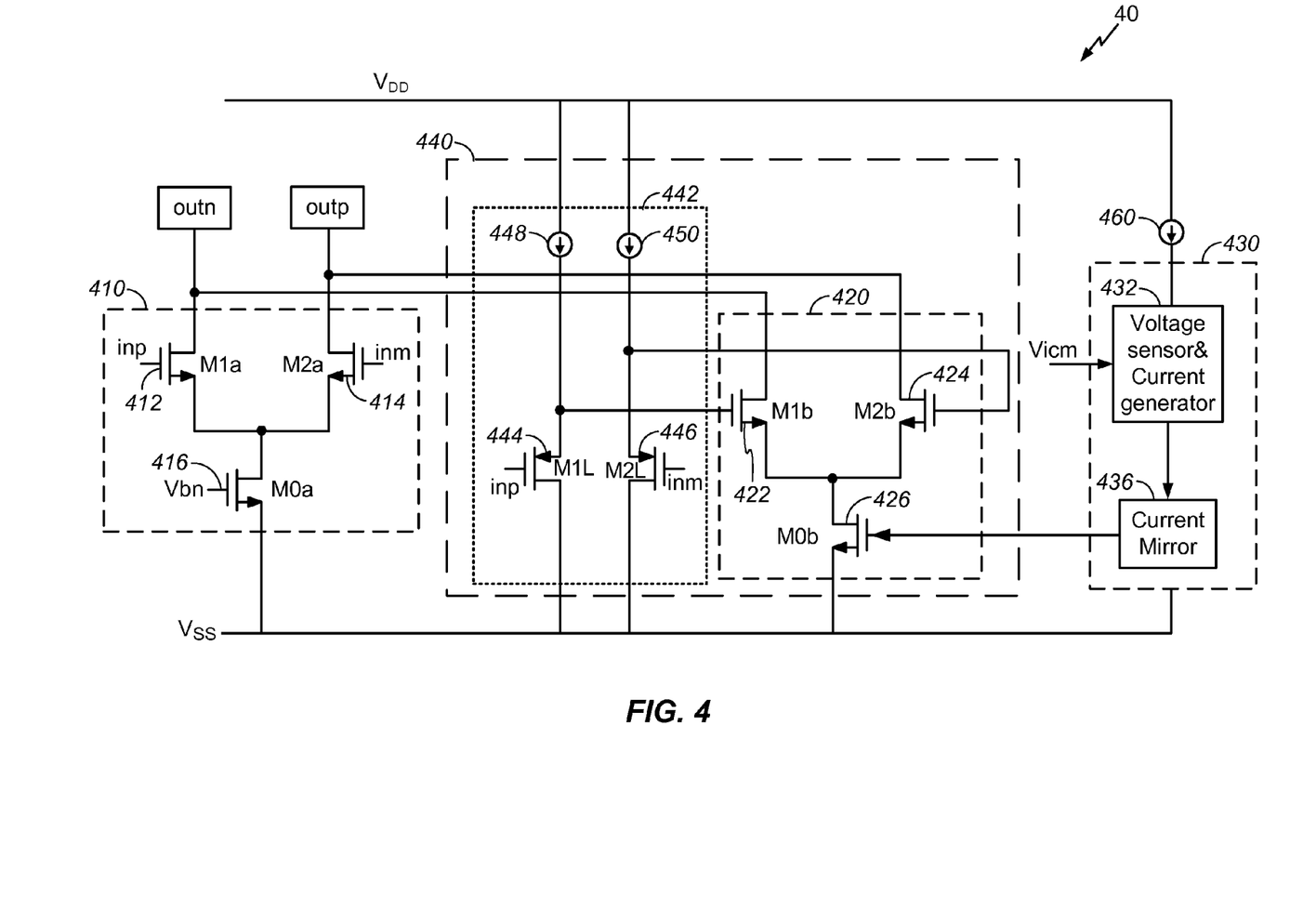
FIG. 4 shows an R-R input stage circuit using non-complementary differential pairs.

FIG. 4 shows an R-R input stage circuit using non-complementary differential pairs. R-R input stage circuit 40 comprises differential pair circuit 410, level shifted differential pair 440 and bias control circuit 430.

Differential pair circuit 410 includes a differential transistor pair and a current source. The differential transistor pair comprises a pair of matched MOS transistors 412, 414. The current source comprises transistor MOS 416.

Level shifted differential pair 440 comprises source follower 442 and differential pair circuit 420. Differential pair circuit 420 includes a differential transistor pair and a current source. Differential transistor pair comprises a pair of matched MOS transistors 422, 424. The current source comprises MOS transistor 426.

Source follower 442 includes a pair of matched PMOS transistors 444 and 446 coupled to bias current sources 448 and 450, respectively.

Differential pair circuit 410 operates over an input common mode voltage range from $V_{SS}+V_{thn}+2*V_{Dsat}$ to $V_{DD}$. A threshold of MOS transistors 412 and 414 is defined as $V_{thn}$. A saturation voltage of MOS transistors 412, 414 and 416 is defined as $V_{Dsat}$. $V_{SS}$ and $V_{DD}$ being the negative and the positive supply, respectively.

Differential pair circuit 420 operates over an input common mode voltage range from $V_{SS}+V_{thn}+2*V_{Dsat}$ to $V_{DD}$. Threshold voltage of MOS transistors 422 and 424 is also $V_{thn}$. Saturation voltage of MOS transistors 422, 424 and 426 is also $V_{Dsat}$.

Source follower 442 shifts up the voltage level of an input signal at the input terminal of the rail-to-rail input stage circuit by $V_{thp}+V_{Dsat}$. A threshold voltage of MOS transistors 444 and 446 is defined as $V_{thp}$. Level shifted differential pair 440 has an input common mode voltage that ranges from $VSS+2*V_{Dsat}+V_{thn}-V_{thp}-V_{\_Dsat\_1s}$ to $V_{DD}-V_{thp}-V_{Dsat}$. Where $V_{Dsat\_1s}$ is the saturation voltage of MOS transistors 444 and 446 of the source follower. By choosing $V_{Dsat\_1s}$ properly, the lower bound can be very close to $V_{SS}$.

Differential pair circuit 410 and level shifted differential pair 440 are coupled in parallel as they have common input terminals inp and inm and common output terminals outp and outn. If $V_{DD}>V_{SS}+V_{thn}+V_{thp}+3*V_{Dsat}$, then R-R input stage circuit 40 supports an input common mode voltage range from negative supply $V_{SS}$ to the positive supply $V_{DD}$.

Bias control circuit 430 includes voltage sensor 432 and current mirror circuit 436. Current source 460 provides the necessary bias current to the bias control circuit. The voltage sensor is controlled by the input common mode voltage Vicm. Vicm is the input common mode voltage of R-R input stage circuit 40. When Vicm is higher than $V_{DD}-V_{thp}-V_{Dsat}$, voltage sensor 432 detects this condition and generates a tracking current inversely proportional to the Vicm. Current mirror circuit 436 mirrors the tracking current to current source 426. As a result, bias control circuit 430 gradually reduces the bias current through level shifted differential pair 440 and eventually cuts it down to zero.

Therefore, when Vicm is outside the input common mode voltage range supported by the level shifted differential pair, level-shifted differential 440 does not affect the normal operation of differential pair circuit 410 and therefore the operation of the R-R input stage circuit.

Bias control circuit 430 does not allow MOS transistors 422 and 424 to enter into the ohmic region, thus does not allow the reduction of the overall output impedance, and consequently the gain, of R-R input stage circuit 40.

The proposed solution avoids the use of a cascode stage at the output of the level shifted differential pair in order to maintain high output impedance when the input common mode voltage is near the positive supply. This is truly advantageous for low voltage operation, as the use of a cascode stage requires a higher supply voltage than a typical differential pair circuit.

The proposed solution also avoids the use of current steering techniques based on current sources that use stacked transistor devices. As a result, the solution is suitable for very low power supply operation.

The solution presented in FIG. 4 is based on NMOS differential pairs. Those of skill would appreciate that the solution can also be based on PMOS differential pairs.

Figure 5:
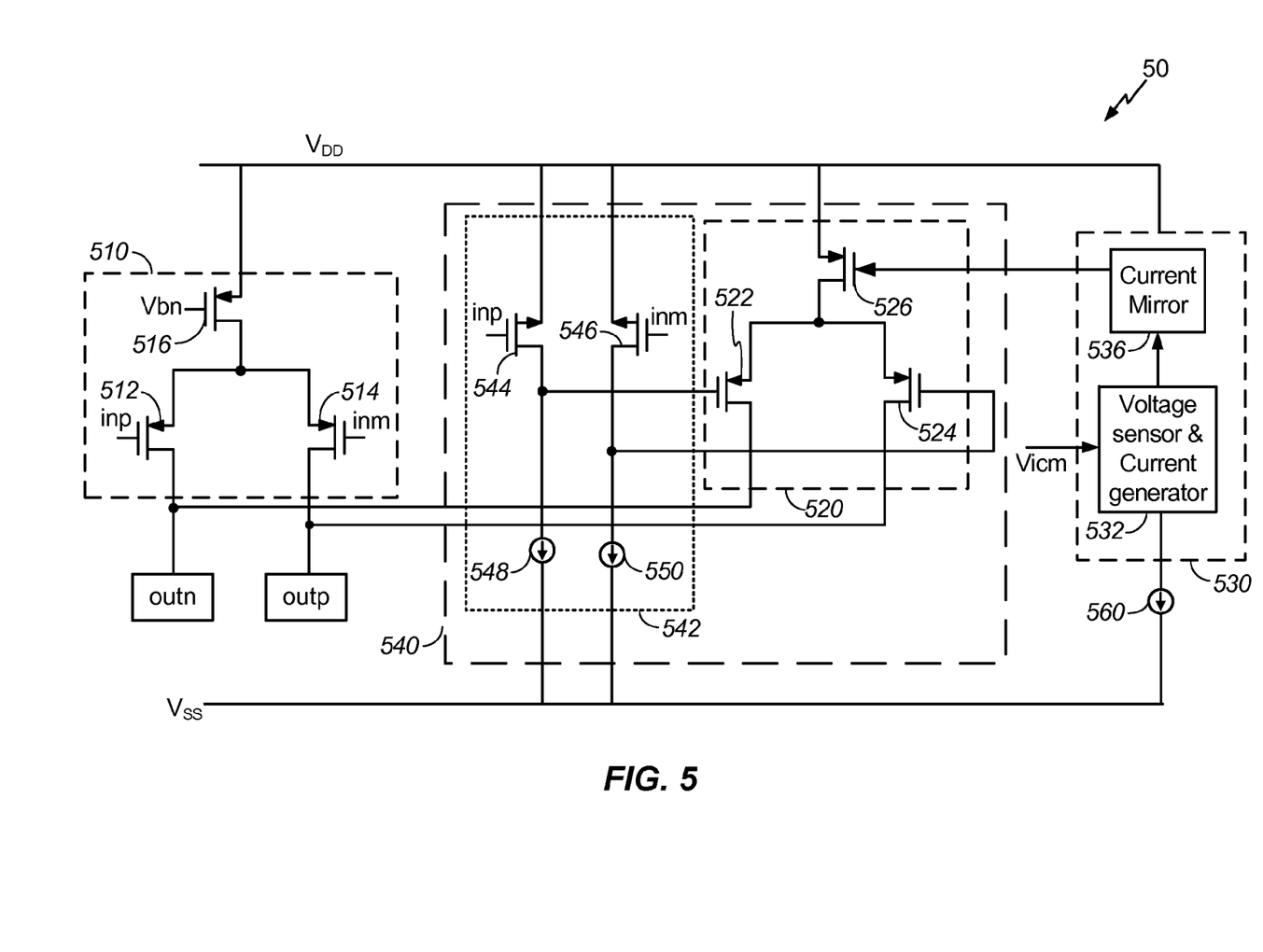
FIG. 5 shows an R-R input stage circuit using non-complementary PMOS differential pairs.

FIG. 5 shows an R-R input stage circuit using non-complementary PMOS differential pairs. R-R input stage circuit 50 comprises differential pair circuit 510, level shifted differential pair 540 and bias control circuit 530.

Differential pair circuit 510 includes a differential transistor pair and a current source. The differential transistor pair comprises a pair of matched MOS transistors 512, 514. The current source comprises transistor MOS 516.

Level shifted differential 540 comprises source follower 542 and differential pair circuit 520. Differential pair circuit 520 includes a differential transistor pair and a current source. Differential transistor pair comprises a pair of matched MOS transistor 522 and 524. The current source comprises MOS transistor 526.

Source follower 542 includes a pair of matched NMOS transistors 544 and 546 coupled to bias current sources 548 and 550, respectively.

Differential pair circuit 510 operates over an input common mode voltage range from $V_{SS}$ to $V_{DD}-V_{thp}-2*V_{Dsat}$. A threshold of MOS transistors 512 and 514 is defined as $V_{thp}$. A saturation voltage of MOS transistors 512, 514 and 416 is defined as $V_{Dsat}$. $V_{SS}$ and $V_{DD}$ are the negative and the positive supply, respectively.

Differential pair circuit 520 operates over an input common mode voltage range from $V_{SS}$ to $V_{DD}-V_{thp}-2*V_{Dsat}$. Threshold voltage of MOS transistors 522 and 524 is also $V_{thp}$. Saturation voltage of MOS transistors 522, 524 and 526 is also $V_{Dsat}$.

Source follower 542 shifts down the voltage level of an input signal at the input terminal of the rail-to-rail input stage circuit by $V_{thn}+V_{Dsat}$. A threshold voltage of MOS transistors 544 and 546 is defined as $V_{thn}$. The saturation voltage of MOS transistors 544 and 546 is also equal to $V_{Dsat}$. Level shifted differential pair 540 has an input common voltage that ranges from $V_{SS}+V_{thn}+V_{Dsat}$ to $V_{DD}-2*V_{Dsat}-V_{thp}+V_{thn}+V_{Dsat\_1s}$. $V_{Dsat\_1s}$ is defined as the saturation voltage of MOS transistors 544 and 546 of source follower 542. By choosing $V_{Dsat\_1s}$ properly, the upper bound of the input common mode voltage range can be near to $V_{DD}$.

Differential pair circuit 510 and level shifted differential pair 540 are coupled in parallel as they have common input terminals inp and inm and common output terminals outp and outn. If $V_{DD}>V_{SS}+V_{thn}+V_{thp}+3*V_{Dsat}$, then R-R input stage circuit 50 supports an input common mode voltage range from negative supply $V_{SS}$ to the positive supply $V_{DD}$.

Bias control circuit 530 includes voltage sensor circuit 532 and current mirror 536. Current source 560 provides the necessary bias current to the bias control circuit. The voltage sensor circuit is controlled by the input common mode voltage Vicm. Vicm is the input common mode voltage of R-R input stage circuit 50. When Vicm is lower than $V_{SS}+V_{thn}+V_{Dsat}$, voltage sensor 532 detects this condition and generates a tracking current inversely proportional to the Vicm. Current mirror 536 mirrors the tracking current to current source 526. As a result, bias control circuit 530 gradually reduces the bias current through level shifted differential pair 540 and eventually cuts it down to zero.

Therefore, when Vicm is outside the input common mode voltage range supported by the level shifted differential pair, level-shifted differential 540 does not affect the normal operation of differential pair circuit 510 and therefore the operation of the R-R input stage circuit.

Bias control circuit 530 does not allow MOS transistors 522 and 524 to enter into the ohmic region, thus does not allow the reduction of the overall output impedance, and consequently the gain, of R-R input stage circuit 50.

R-R input stage circuit 50 also avoids the use of a cascode stage at the output of the level shifted differential pair in order to maintain high output impedance when the input common mode voltage is close to the negative power supply. This is truly advantageous for low voltage operation, as the use of a cascode stage requires a higher supply voltage than a typical differential pair circuit.

R-R input stage circuit 50 also avoids the use of current steering techniques based on current sources that use stacked transistor devices. As a result, this solution is suitable for very low power supply operation.

Figure 6:
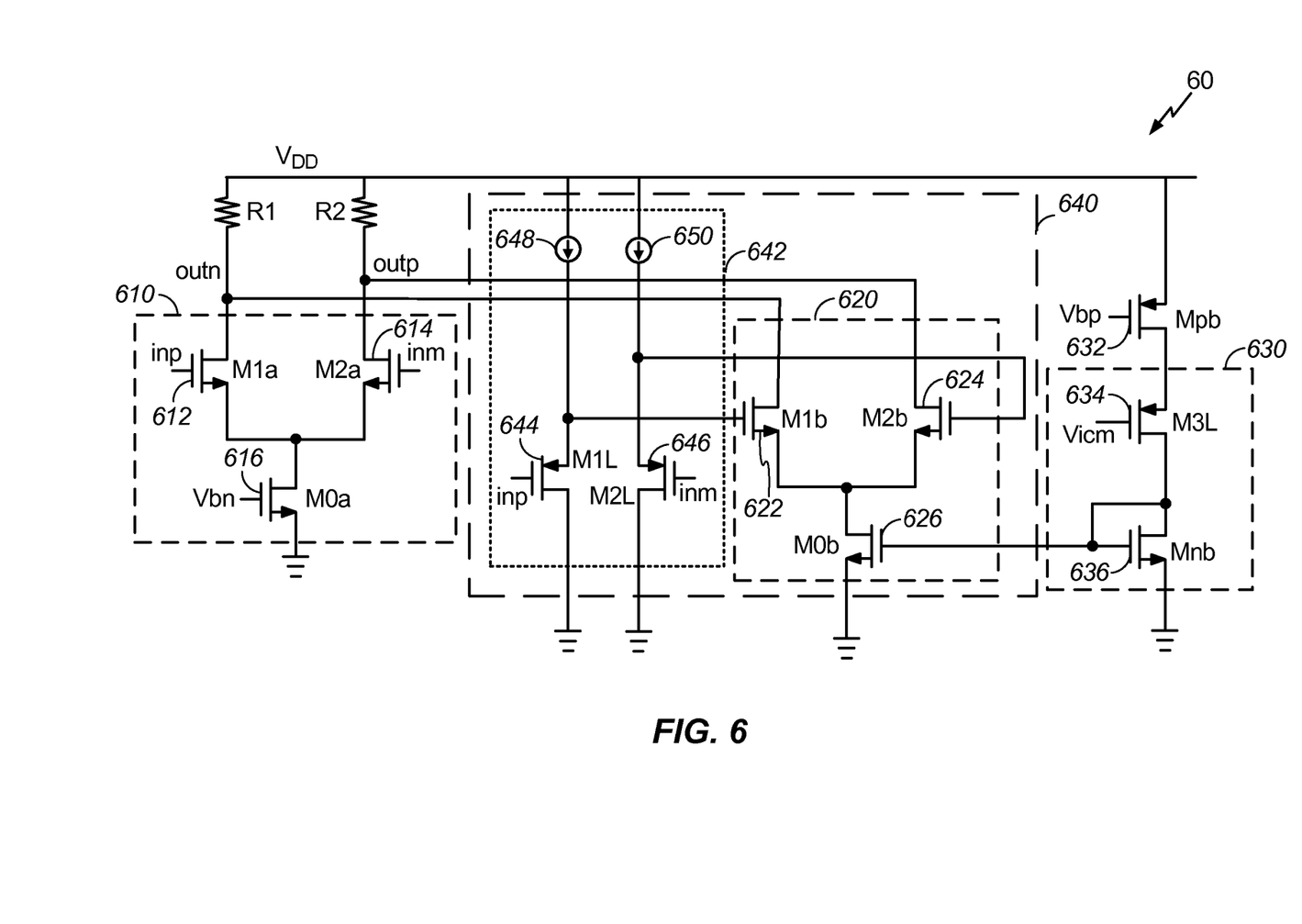
FIG. 6 shows an exemplary embodiment of an R-R input stage circuit configured as a single stage amplifier, using non-complementary differential pairs including an exemplary bias control circuit.

FIG. 6 shows an exemplary embodiment of an R-R input stage circuit configured as a single stage amplifier, using non-complementary differential pairs including an exemplary bias control circuit.

R-R input stage circuit 60 is based on the R-R input stage circuit of FIG. 4, where the bias control circuit comprises MOS transistors 634 and 636. MOS transistor 634 functions as a voltage sensor detecting the input common mode voltage Vicm of the R-R input stage circuit. MOS transistor 634 generates a tracking current inversely proportional to Vicm, when Vicm is higher than $V_{DD}-V_{thp}-V_{Dsat}$.

MOS transistor 636 functions as a current mirror circuit that mirrors the tracking current to current source 626. As a result, bias control circuit 630 gradually reduces the bias current through level shifted differential pair 640 and eventually cuts it down to zero.

Bias control 430, 530 and 630 discussed as part of the exemplary embodiments presented in FIG. 4, FIG. 5 and FIG. 6 control the bias current of level shifted differential pair 440, 540 and 640, respectively, respond to the Vicm, when Vicm is outside the input common mode voltage range supported by the level shifted differential pair. As a result, the level-shifted differential pair does not affect the normal operation of differential pair circuit 410, 510 and 610 and therefore the operation of R-R input stage circuit 40, 50 and 60, respectively.

A similar bias control technique may also be needed when the Vicm is outside the input common mode voltage range supported by the differential pair. Such a technique is presented in FIG. 7.

Figure 7:
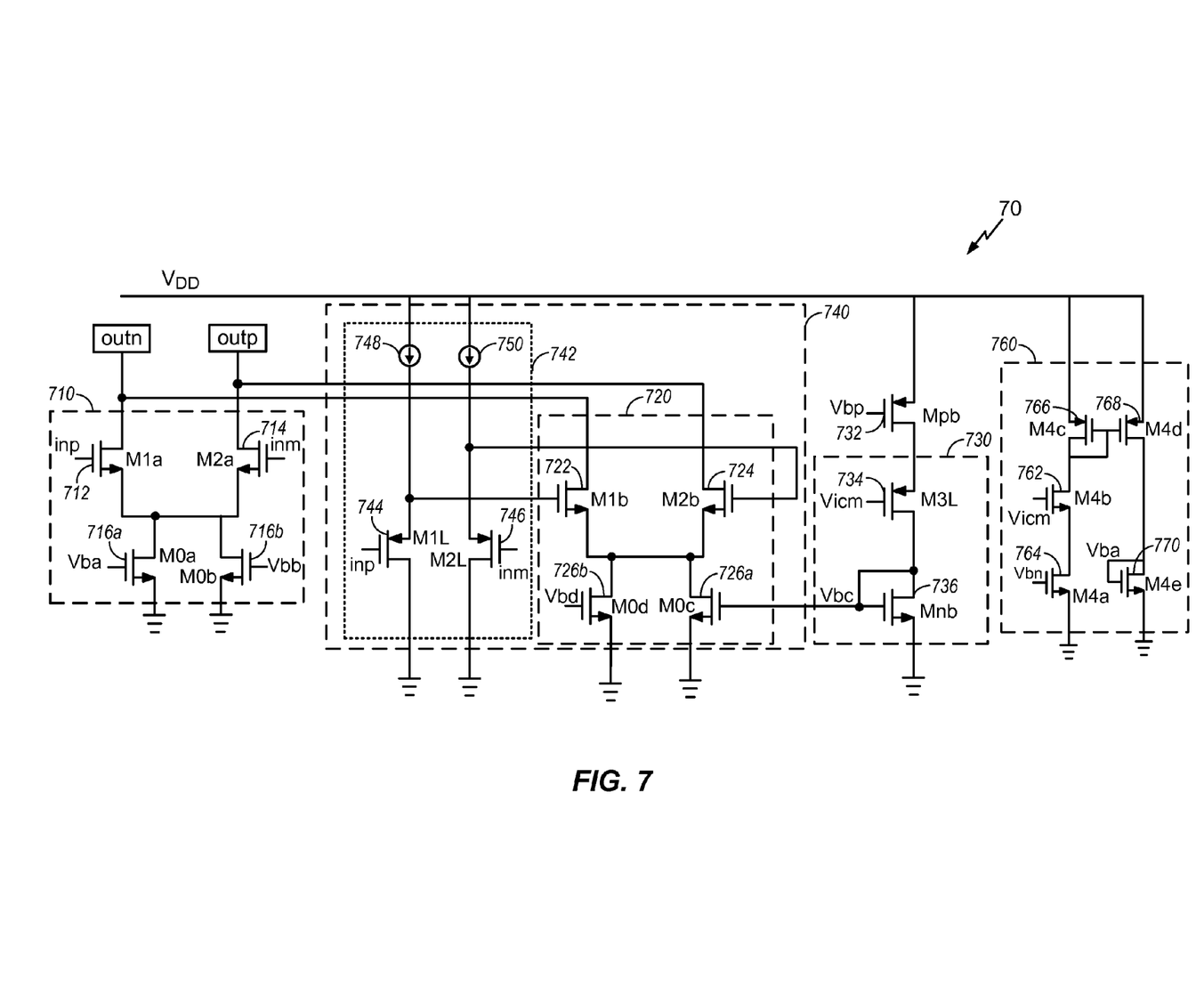
FIG. 7 shows an R-R input stage circuit using non-complementary differential pairs including a second bias control circuit for controlling the output impedance of the R-R input stage circuit.

FIG. 7 shows an R-R input stage circuit using non-complementary differential pairs including a second bias control circuit for controlling the output impedance of the R-R input stage circuit. R-R input stage circuit 70 comprises differential pair circuit 710, level shifted differential pair 740, first bias control circuit 730 and second bias control circuit 760.

Differential pair circuit 710 includes a differential transistor pair and a current source. The differential transistor pair comprises a pair of matched MOS transistors 712, 714. The current source comprises transistors MOS 716a and 716b.

Level shifted differential pair 740 comprises source follower 742 and differential pair circuit 720. Differential pair circuit 720 includes a differential transistor pair and a current source. Differential transistor pair comprises a pair of matched MOS transistors 722, 424. The current source comprises MOS transistors 726a and 726b.

Source follower 742 includes a pair of matched NMOS transistors 744 and 746 coupled to bias current sources 748 and 750, respectively.

R-R input stage circuit 70 supports an input common mode voltage range from the negative supply $V_{SS}$ to the positive supply $V_{DD}$, as it operates similarly to R-R input stage circuit 40.

First bias control circuit 730 comprises MOS transistors 734 and 736. MOS transistor 734 functions as a voltage sensor detecting the input common mode voltage Vicm of the R-R input stage circuit. MOS transistor 734 generates a tracking current inversely proportional to Vicm, when Vicm is higher than $V_{DD}-V_{thp}-V_{Dsat}$.

MOS transistor 736 functions as a current mirror circuit that mirrors the tracking current to MOS transistor 726a. As a result, first bias control circuit 730 gradually reduces the bias current through level shifted differential pair 740.

Second bias control circuit 760 comprises MOS transistors 764, 762, 766, 768 and 770. In a similar fashion to the first bias control circuit, MOS transistor 762 functions as a voltage sensor detecting the input common mode voltage Vicm of the R-R input stage circuit. MOS transistor 764 generates a tracking current inversely proportional to Vicm, when Vicm is lower than $V_{SS}+V_{thn}+V_{Dsat}$. MOS transistors 766, 768 and 770 mirror the tracking current to MOS transistor 716a. As a result, second bias control circuit 760 reduces the bias current through differential pair circuit 710 when the Vicm is outside the input common mode voltage range supported by differential pair circuit 710. Therefore, differential pair circuit 710 does not affect the normal operation of level shifted differential pair 740 and the operation of R-R input stage circuit 70.

In the embodiments presented above, the transconductance of the R-R input stage circuit is not constant over the entire input common mode voltage range of the R-R input stage circuit. It is beneficial to maintain the transconductance of the R-R input stage circuit constant as it results in a constant gain of the R-R input stage circuit over its entire input common mode voltage range. A technique to keep the transconductance of the R-R input stage circuit within desired limits will be discussed with reference to FIG. 8.

Figure 8:
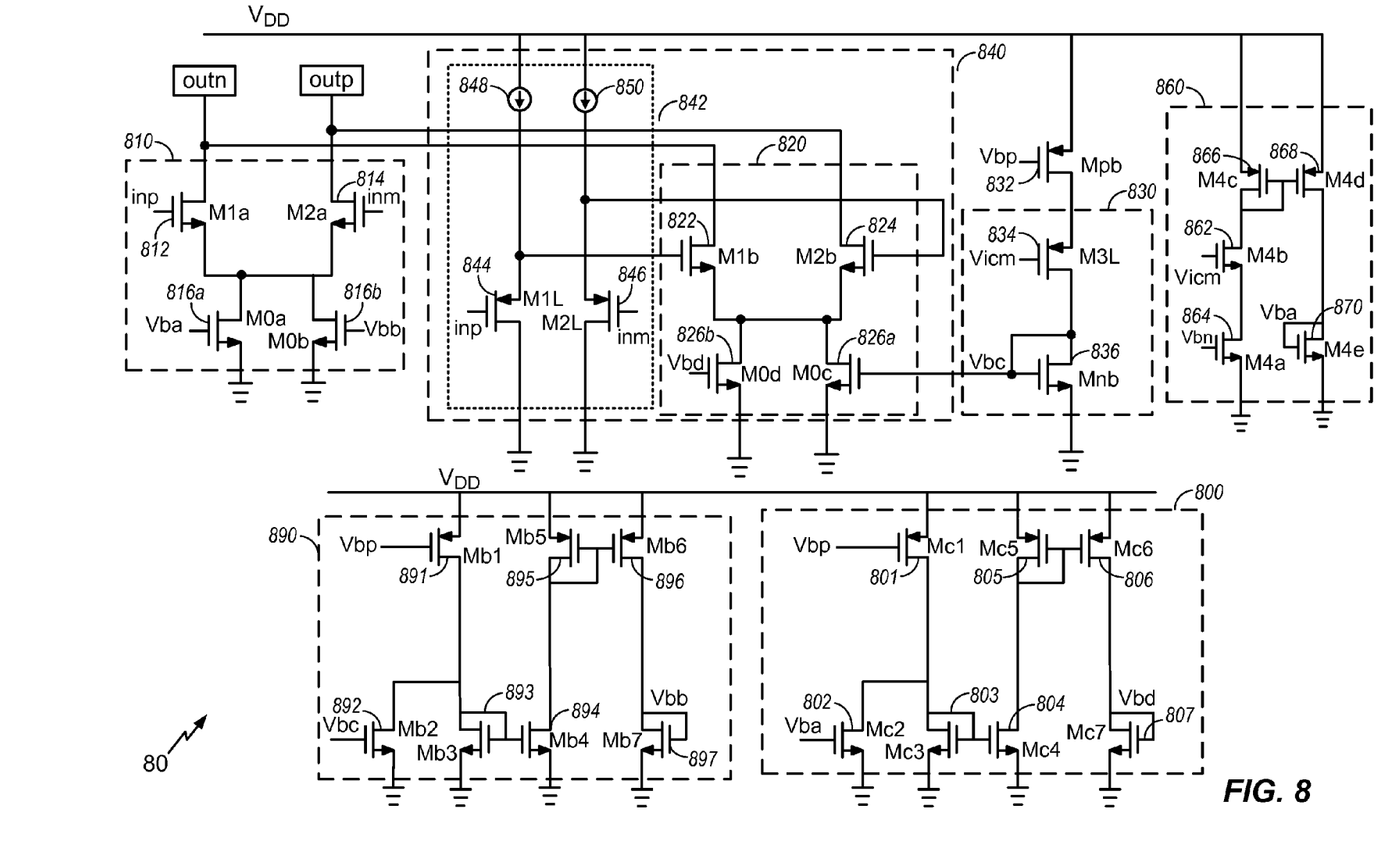
FIG. 8 shows a R-R input stage circuit using non-complementary differential pairs including gm control circuits for controlling the transconductance of the R-R input stage circuit.

FIG. 8 shows an R-R input stage circuit using non-complementary differential pairs including gm control circuits for controlling the transconductance of the R-R input stage circuit.

R-R input stage circuit 80 comprises differential pair circuit 810, level shifted differential pair circuit 840, first bias control circuit 830, second bias control circuit 860, first gm control circuit 890 and second gm control circuit 800.

Differential pair circuit 810 includes a differential transistor pair and a current source. The differential transistor pair comprises a pair of matched MOS transistors 812, 814. The current source comprises transistors MOS 816a and 816b.

Level shifted differential pair 840 comprises source follower 842 and differential pair circuit 820. Differential pair circuit 820 includes a differential transistor pair and a current source. Differential transistor pair comprises a pair of matched MOS transistors 822 and 824. The current source comprises MOS transistors 826a and 826b.

Source follower 842 includes a pair of matched NMOS transistors 844 and 846 coupled to corresponding current sources 848 and 850 respectively.

R-R input stage circuit 80 supports an input common mode voltage range from the negative supply $V_{SS}$ to the positive supply $V_{DD}$, as it operates similarly to R-R input stage 70 with respect to the operation of the first and the second bias control circuits.

First bias control circuit 830 comprises MOS transistors 834 and 836. MOS transistor 834 functions as a voltage sensor detecting the input common mode voltage Vicm of the R-R input stage circuit. MOS transistor 834 generates a tracking current inversely proportional to Vicm, when Vicm is higher than $V_{DD}-V_{thp}-V_{Dsat}$. MOS transistor 836 mirrors the tracking current to MOS transistor 826a.

Second bias control circuit 860 comprises MOS transistors 864, 862, 866, 868 and 870. In a similar fashion to the first bias control circuit, MOS transistor 862 functions as a voltage sensor detecting the input common voltage Vicm of the R-R input stage circuit. MOS transistor 864 generates a tracking current inversely proportional to Vicm, when Vicm is lower than $V_{SS}+V_{thn}+V_{Dsat}$. MOS transistors 866, 868 and 870 mirror the tracking current to MOS transistor 816a.

First gm control circuit 890 comprises MOS transistors 891, 892, 893, 894, 895, 896 and 897. First gm control circuit 890 has a first terminal (Vbc) coupled to MOS transistor 836 and a second terminal (Vbb) coupled to MOS transistor 816b to adjust the current of MOS transistor 816b of the current source of differential pair circuit 810 in response to the voltage level of the input common mode voltage Vicm of the R-R input stage circuit. As a result, first gm control circuit adjusts the transconductance of differential pair circuit 810 to maintain the transconductance of the R-R input stage circuit substantially constant when the input common mode voltage Vicm ranges from $V_{DD}-V_{thp}-V_{Dsat}$ to $V_{DD}$.

Second gm control circuit 800 comprises MOS transistors 801, 802, 803, 804, 805, 806 and 897. Second gm control circuit 800 has a first terminal (Vba) coupled to MOS transistor 870 and a second terminal (Vbd) coupled to MOS transistor 826b to adjust the current of MOS transistor 826b of the current source of differential pair circuit 820 in response to the voltage level of the input common mode voltage Vicm of the R-R input stage circuit. As a result, second gm control circuit adjusts the transconductance of level shifted differential pair 840 to maintain the transconductance of the R-R input stage circuit substantially constant when the input common mode voltage Vicm ranges from $V_{SS}$ to $V_{SS}+V_{thn}+V_{Dsat}$.

First gm control circuit generates a bias current $I\_M_{b7}$ running through MOS transistor 897. MOS transistor 897 mirrors current $I\_M_{b7}$ to MOS transistor 816b to set its current to $I\_M_{0b}$. Current $I\_M_{b7}$ equals $I\_M_{b1}$ minus $I\_M_{b2}$, where $I\_M_{b1}$ is the bias current provided by MOS transistor 891 and $I\_M_{b2}$ is the bias current provided by MOS transistor 892. $I\_M_{b2}$ is set by first bias control circuit 830.

When Vicm of R-R input stage circuit 80 is within the input common mode voltage range supported by level shifted differential pair 840 then, $I\_M_{b1}=I\_M_{b2}$ and therefore $I\_M_{b7}=0$ and $I\_M_{0b}=0$.

Second gm control circuit generates bias current $I\_M_{c7}$ in MOS transistor 807. MOS transistor 807 mirrors current $I\_M_{c7}$ to MOS transistor 826b to set its current to $I\_M_{0d}$. Current $I\_M_{c7}$ equals to $I\_M_{c1}$ minus $I\_M_{c2}$, where $I\_M_{c1}$ is the bias current provided by MOS transistor 801 and $I\_M_{c2}$ is the bias current provided by MOS transistor 802. $I\_M_{c2}$ is set by second bias control circuit 860.

When Vicm of R-R input stage circuit 80 is within the input common mode voltage range supported by differential pair 810, then $I\_M_{c1}=I\_M_{c2}$ and therefore $I\_M_{c7}=0$ and $I\_M_{0d}=0$.

When the input common mode voltage ranges from $V_{SS}$ to $VSS+V_{thn}+V_{Dsat}$, the voltage at node Vba, which is the output of the second bias control circuit, is low. As a result, MOS transistor 816a and transistor 802 are almost turned off. As MOS transistor 802 turns off, the current of MOS transistor 807 of the second gm control circuit increases up to its nominal value $I\_M_{0d}$. As the current through MOS transistor 826b increases, the transconductance of the R-R input stage increases accordingly. As, both MOS transistors 826a and 826b are on, the transconductance of the R-R input stage circuit is a function of the ratio of the width over length of MOS transistor 822, defined as W/L_M1b, and the total current provided by MOS transistors 826a and 826b, defined as $(I\_M_{0c}+I\_M_{0d})$. The ratio of the width over length of MOS transistor 822 equals the ratio of the width over length of MOS transistor 824.

In a similar fashion, when the input common mode voltage ranges from $V_{DD}-V_{thp}-V_{Dsat}$ to $V_{DD}$, the current of the first bias control circuit is reduced. As a result, MOS transistors 826a and MOS transistor 892 are almost turned off. As MOS transistor 892 turns off, the current of MOS transistor 897 of the second gm control circuit increases up to its nominal value $I\_M_{0b}$. As the current through MOS transistor 816b increases, the transconductance of the R-R input stage circuit increases accordingly. As both MOS transistors 816a and 816b are on, the transconductance of the R-R input stage circuit is a function of the ratio of the width over length of MOS transistor 812, defined as W/L_M1a, and the total current provided by MOS transistors 816a and 816b, defined as $(I+M_{0a}+I\_M_{0b})$. The ratio of the width over length of MOS transistor 812 equals the ratio of the width over length of MOS transistor 814.

When the input common mode voltage is in the range supported by both differential pair circuit 810 and level shifted differential pair 840, the first bias control circuit operates at its nominal current and as a result, first gm control circuit 890 turns off MOS transistor 816b. Similarly, the second bias control circuit operates also at its nominal current and as a result, second gm control circuit 800 turns off MOS transistor 826b.

As a result, the transconductance of R-R input stage circuit is a function of $W/L\_M1a*I\_M_{0a}$ and $W/L\_M1b*I\_M_{0c}$. $I\_M_{0a}$ is the nominal bias current through MOS transistor 816a and $I\_M_{0c}$ is the nominal bias current through MOS transistor 826a. W/L_M1a is the ratio of the width over length of both MOS transistors 812 and 814. W/L_M1b is the ratio of the width over length of both MOS transistors 822 and 824.

The ratio of the width over length of MOS transistor 816a is defined as W/L_M0a. The ratio of width over length of MOS transistor 826a is defined as W/L_M0c. The ratio of width over length of MOS transistor 816b is defined as W/L_M0b. The ratio of width over length of MOS transistor 826b is defined as W/L_M0d. W/L_M0a is set equal to W/L_M0c. W/L_M0b is set equal to W/L_M0d. When an appropriate ratio of the W/L_M0a over the W/L_M0b is set, then the transconductance of the R-R input stage circuit is kept substantially constant over its entire input common mode range.

Figure 9:
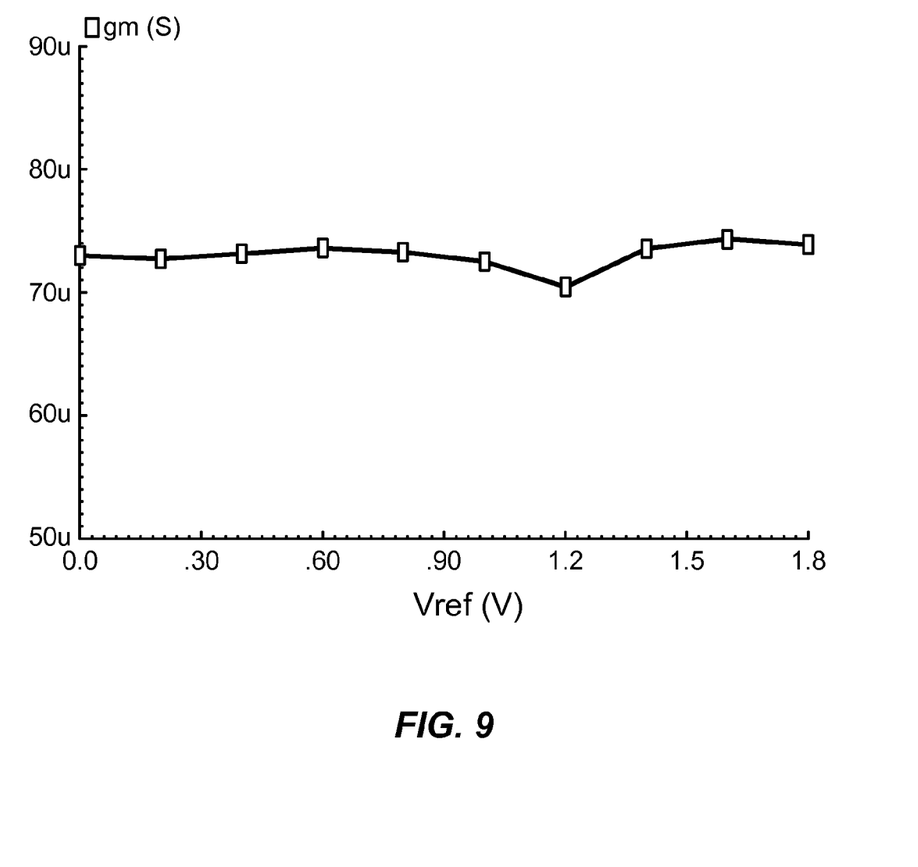
FIG. 9 shows the simulated transconductance versus the input common-mode voltage of the exemplary embodiment of FIG. 8.

FIG. 9 shows the simulated transconductance versus the input common-mode voltage of the exemplary embodiment of FIG. 8. As can be seen, the transconductance variation is less than 5% over the entire common-mode voltage range.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A rail-to-rail (R-R) input stage circuit operating over a rail-to-rail input common mode voltage range, comprising:
   a differential pair circuit, having a first input common mode voltage range, coupled to a level shifted differential pair, having a second input common mode voltage range to enable operation of the R-R input stage circuit over an input common mode voltage that extends from a negative power supply to a positive power supply; and
   a first bias control circuit, coupled to the level shifted differential pair, to dynamically control the bias current of the level shifted differential pair when the input common mode voltage of the R-R input stage circuit is outside the second input common voltage range.

2. The R-R input stage circuit of claim 1, where the first bias control circuit gradually turns off the level shifted differential pair in response to the input common mode voltage of the R-R input stage circuit.

3. The R-R input stage circuit of claim 1, where the first bias control circuit further comprises a voltage sensor circuit for generating a tracking current inversely proportional to a sensed input common mode voltage of the R-R input stage, when the input common mode voltage of the R-R input stage circuit is outside the second input common voltage range.

4. The R-R input stage circuit of claim 3, further comprising a current mirror circuit having one terminal coupled to the voltage sensor circuit and a second terminal coupled to the current source of the level shifted differential pair to control the bias current of the level shifted differential pair in response to the tracking current.

5. The R-R input stage circuit of claim 3, where the voltage sensor circuit is a MOS device, and where the input common mode voltage of the R-R input stage circuit controls the gate of the MOS device.

6. The R-R input stage circuit of claim 4, where the current mirror comprises a MOS device, having its gate and drain coupled to the voltage sensor circuit and to the current source of the level shifted differential pair.

7. The R-R input stage circuit of claim 1, where the differential pair circuit comprises a pair of matched MOS transistors and a current source.

8. The R-R input stage circuit of claim 1, where the level shifted differential pair comprises a source follower and a differential pair circuit, where the differential pair circuit comprises a pair of matched MOS transistors and a current source.

9. The source follower of claim 8, comprising a pair of matched MOS transistors of type complementary to that of the MOS transistors of the differential pair circuit.

10. The R-R input stage circuit of claim 3, further comprising a second bias control circuit, coupled to the differential pair circuit, to dynamically control the bias current of the differential pair circuit when the input common mode voltage of the R-R input stage circuit is outside the first input common mode voltage range.

11. The R-R input stage circuit of claim 10, where the second bias control circuit gradually turns off the differential pair circuit in response to the input common mode voltage of the R-R input stage circuit.

12. The R-R input stage circuit of claim 10, further comprising a first gm control circuit having a first terminal coupled to the first bias control circuit and a second terminal coupled to the current source of the differential pair circuit, where the first gm control circuit adjusts the current through the differential pair circuit to maintain the transconductance of the R-R input stage circuit substantially constant when the input common mode voltage of the R-R input stage circuit is outside the first input common mode voltage range.

13. The R-R input stage circuit of claim 12, where the first gm control circuit adjusts the current through the differential pair circuit in response to the tracking current generated by the first bias control circuit.

14. The R-R input stage circuit of claim 13, further comprising a second gm control circuit having a first terminal coupled to the second bias control circuit and a second terminal coupled to the current source of the level shifted differential pair, where the second gm control circuit adjusts the current through the level-shifted differential pair to maintain substantially constant the transconductance of the R-R input stage circuit when the input common mode voltage of the R-R input stage circuit is outside the first input common mode voltage range.

15. The R-R input stage circuit of claim 14, where the second gm control circuit adjusts the current through the level shifted differential pair in response to the tracking current generated by the second bias control circuit.

16. A rail-to-rail (R-R) input stage circuit operating over a rail-to-rail input common mode voltage range, comprising:
    a differential pair circuit, having a first input common mode voltage range, coupled to a level shifted differential pair, having a second input common mode voltage range to enable operation of the R-R input stage circuit over an input common mode voltage that extends from negative power supply to positive power supply; and
    first means, coupled to the level shifted differential pair, for dynamically controlling the bias current of the level shifted differential pair when the input common mode voltage of the R-R input stage circuit is outside of the second input common mode voltage range.

17. The R-R input stage circuit of claim 16, where the first means gradually turns off the level shifted differential pair in response to the input common mode voltage of the R-R input stage circuit.

18. The R-R input stage circuit of claim 16, where the first means includes means for sensing the input common mode voltage of the R-R input stage circuit.

19. The R-R input stage circuit of claim 18, where the means for sensing also generate a tracking current inversely proportional to the sensed input common mode voltage, when the input common mode voltage of the R-R input stage circuit is outside the second input common mode voltage range.

20. The R-R input stage circuit of claim 19, where the first means further comprises means for mirroring the tracking current to the current source of the level shifted differential pair to control the bias current of the level shifted differential pair.

21. The R-R input stage circuit of claim 19, further comprising second means coupled to the differential pair circuit, to dynamically control the bias current of the differential pair circuit when the input common mode voltage of the R-R input stage circuit is outside the first input common mode voltage range.

22. The R-R input stage circuit of claim 21, where the second means gradually turns off the differential pair circuit in response to the input common mode voltage of the R-R input stage circuit.

23. The R-R input stage circuit of claim 22, where the second means includes means for sensing the input common mode voltage of the R-R input stage circuit.

24. The R-R input stage circuit of claim 23, where the means for sensing also generate a tracking current inversely proportional to the sensed input common mode voltage, when the input common mode voltage of the R-R input stage circuit is outside the first input common mode voltage range.

25. The R-R input stage circuit of claim 19, further comprising first gm control means having a first terminal coupled to the first means and a second terminal coupled to the differential pair circuit, where the first gm control means adjusts the current through the differential pair circuit in response to the tracking current generated by the first means, to maintain the transconductance of the R-R input stage circuit substantially constant when the input common mode voltage of the R-R input stage circuit is outside the first input common mode voltage range.

26. The R-R input stage circuit of claim 25, further comprising second gm control means having a first terminal coupled to the second means and a second terminal coupled to the level shifted differential pair, where the second gm control means adjust the current through the level shifted differential pair in response to the tracking current generated by the second means, to maintain the transconductance of the R-R input stage circuit substantially constant when the input common mode voltage of the R-R input stage circuit is outside the second input common mode voltage range.

* * * * *